(12) United States Patent
Tochi et al.

(10) Patent No.: US 7,636,994 B2
(45) Date of Patent: Dec. 29, 2009

(54) METHOD OF MAKING A PIEZOELECTRIC DEVICE

(75) Inventors: Kenichi Tochi, Tokyo (JP); Masahiro Miyazaki, Tokyo (JP); Takao Noguchi, Tokyo (JP); Hiroshi Yamazaki, Tokyo (JP); Ken Unno, Tokyo (JP); Hirofumi Sasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 231 days.

(21) Appl. No.: 11/360,394

(22) Filed: Feb. 24, 2006

(65) Prior Publication Data

US 2006/0205225 A1 Sep. 14, 2006

(30) Foreign Application Priority Data

Jun. 13, 2005 (JP) ............................ P2005-172477

(51) Int. Cl.
*H01L 41/22* (2006.01)
*H01L 41/00* (2006.01)
*H03H 9/00* (2006.01)

(52) U.S. Cl. .................... 29/25.35; 29/25.41; 29/25.42; 29/830; 29/846; 310/311; 310/313 A; 333/187

(58) Field of Classification Search .................... 29/830, 29/832, 835, 846, 852, 829, 825, 25.35, 25.42, 29/592.1, 594, 620–623; 156/313, 314, 330; 174/259, 264; 216/20, 62, 72, 73, 78; 310/311, 310/313 A; 333/187, 195–198

See application file for complete search history.

(56) References Cited

U.S. PATENT DOCUMENTS

| 5,071,359 A | * | 12/1991 | Arnio et al. ............... 439/91 |
| 5,229,789 A | * | 7/1993 | Kishida et al. ............. 347/209 |
| 5,736,456 A | * | 4/1998 | Akram ..................... 438/614 |
| 5,753,934 A | | 5/1998 | Yano et al. |
| 5,801,105 A | | 9/1998 | Yano et al. |
| 5,874,009 A | * | 2/1999 | Inada et al. ............... 216/20 |
| 5,903,058 A | * | 5/1999 | Akram ..................... 257/778 |

(Continued)

FOREIGN PATENT DOCUMENTS

JP    A 11-321801    11/1999

(Continued)

*Primary Examiner*—Minh Trinh
*Assistant Examiner*—Tai Nguyen
(74) *Attorney, Agent, or Firm*—Oliff & Berridge, PLC (57) ABSTRACT

The present invention provides an electronic device with improved characteristics and a method of making the electronic device. In a method of making an electronic device (piezoelectric device) 74 according to the present invention, an outer edge R1 of a piezoelectric film 52A formed on an electrode film 46A of a laminate 60 is located inside an outer edge R2 of the electrode film 46A. For this reason, in removal of a monocrystalline Si substrate 14 from a multilayer board 61, where an etching solution permeates between polyimide 72 and laminate 60, the etching solution circumvents the electrode film 46A before it reaches the piezoelectric film 52A. Namely, a route A of the etching solution to the piezoelectric film 52A is significantly extended by the electrode film 46A. In the method of making the electronic device 74, therefore, the etching solution is less likely to reach the piezoelectric film 52A. It significantly suppresses a situation of dissolution of the piezoelectric film 52A and realizes improvement in characteristics of the piezoelectric device 74 made.

11 Claims, 8 Drawing Sheets

U.S. PATENT DOCUMENTS

| | | | | |
|---|---|---|---|---|
| 5,935,452 A | * | 8/1999 | Inada et al. | 216/20 |
| 5,966,787 A | * | 10/1999 | Nakayama et al. | 29/25.35 |
| 6,165,629 A | * | 12/2000 | Sachdev et al. | 428/626 |
| 6,629,366 B1 | * | 10/2003 | Kobayashi | 29/846 |
| 6,645,685 B2 | * | 11/2003 | Takata et al. | 430/31 |
| 6,758,459 B1 | | 7/2004 | Heikkinen et al. | |
| 2002/0006733 A1 | | 1/2002 | Noguchi et al. | |

FOREIGN PATENT DOCUMENTS

| | | |
|---|---|---|
| JP | A 2001-313429 | 11/2001 |
| JP | 3310881 | 5/2002 |
| JP | A 2002-164586 | 6/2002 |
| JP | A 2003-229611 | 8/2003 |

* cited by examiner

METHOD OF MAKING A PIEZOELECTRIC DEVICE

BACKGROUND OF THE INVENTION

1. Field of the Invention

The present invention relates to an electronic device with a multilayer structure and a method of making the same.

2. Related Background Art

There are conventional thin-film piezoelectric elements being a type of electronic devices in this technical field, for example, as disclosed in Japanese Patent Application Laid-Open No. 2003-229611 and others. For fabricating the thin-film piezoelectric element described in this Application, two silicon substrates are first prepared and a (200) plane preferentially oriented MgO film is deposited on a surface of each substrate. Then a first electrode film, a piezoelectric film, and a second electrode film are successively laid on each substrate with the MgO film thereon, thereby fabricating two multilayer substrates. Then these multilayer substrates are bonded to each other with an adhesive so that their electrode films face each other. Thereafter, only one silicon substrate is removed by etching. Then forming into a predetermined element shape by dry etching or the like and coating with resin, thereafter, the other silicon substrate is removed by etching to complete fabrication of the thin-film piezoelectric element. Related technologies are also disclosed in Japanese Patent Applications Laid-Open No. 2002-164586, Laid-Open No. 2001-313429, and Laid-Open No. 11-312801, and Japanese Patent No. 3310881.

However, the aforementioned conventional electronic device has the following problem. Namely, the step of removing the second substrate by etching sometimes involved permeation of an etching solution through a joint between the coating resin (protecting film) and the laminate comprised of the electrode films and piezoelectric films. If this etching solution permeates up to the piezoelectric film, the piezoelectric film will be dissolved to heavily degrade the characteristics of the piezoelectric element fabricated. It also leads to reduction of yield and reduction of productivity of the electronic device.

The present invention has been accomplished to solve the above problem and an object of the present invention is therefore to provide an electronic device with improved characteristics and a method of making the electronic device.

SUMMARY OF THE INVENTION

The method of making an electronic device according to the present invention is a method of making an electronic device by removing with an etching solution a substrate from a multilayer board having a laminate to become the electronic device formed on the substrate, the method comprising: a step of depositing on the substrate, the laminate comprising a first thin film, and a second thin film being formed on the first thin film and more likely to be dissolved in the etching solution than the first thin film; a step of forming a protecting film to cover the laminate; and a step of removing the substrate from the multilayer board, using the etching solution, wherein in the step of depositing the laminate, the second thin film is deposited so that an outer edge of the second thin film is located inside an outer edge of at least a portion of the first thin film.

In this method of making the electronic device, the outer edge of the second thin film formed on the first thin film of the laminate is located inside the outer edge of at least a portion of the first thin film. For this reason, when the etching solution permeates between the protecting film and the laminate in the removal of the substrate from the multilayer board, the etching solution circumvents the first thin film before arrival at the second thin film, in the marginal region where the outer edge of the second thin film is located inside the outer edge of the first thin film. Namely, the path of the etching solution to the second thin film is significantly extended by the first thin film. It is noted herein that in the conventional method of making the electronic device the first thin film and the second thin film are made with their outer edges approximately coinciding with each other and thus the etching solution directly reaches the second thin film, without circumventing the first thin film. In the method of making the electronic device according to the present invention, therefore, the path of the etching solution to the second thin film is extended, whereby the etching solution is less likely to reach the second thin film. It significantly suppresses the situation of dissolution of the second thin film to achieve improvement in the characteristics of the electronic device fabricated. In addition, avoidance of dissolution of the second thin film also leads to improvement in the yield and productivity of this electronic device. The deposition (film formation) in the present invention is assumed to encompass not only a process of depositing a film material on a predetermined substrate to form a film, but also a process of forming a film and thereafter shaping (patterning) the film.

The method of making an electronic device according to the present invention is a method of making an electronic device by removing with an abrasive containing a liquid a substrate from a multilayer board having a laminate to become the electronic device formed on the substrate, the method comprising: a step of depositing on the substrate, the laminate comprising a first thin film, and a second thin film being formed on the first thin film and more likely to be dissolved in the abrasive than the first thin film; a step of forming a protecting film to cover the laminate; and a step of removing the substrate from the multilayer board, using the abrasive, wherein in the step of depositing the laminate, the second thin film is deposited so that an outer edge of the second thin film is located inside an outer edge of at least a portion of the first thin film.

In this method of making the electronic device, the outer edge of the second thin film formed on the first thin film of the laminate is located inside the outer edge of at least a portion of the first thin film. For this reason, when the abrasive permeates between the protecting film and the laminate in the removal of the substrate from the multilayer board, the abrasive circumvents the first thin film before arrival at the second thin film, in the marginal region where the outer edge of the second thin film is located inside the outer edge of the first thin film. Namely, the path of the abrasive to the second thin film is significantly extended by the first thin film. It is noted herein that in the conventional method of making the electronic device the first thin film and the second thin film are made with their outer edges approximately coinciding with each other and thus the abrasive directly reaches the second thin film, without circumventing the first thin film. In the method of making the electronic device according to the present invention, therefore, the path of the abrasive to the second thin film is extended, whereby the abrasive is less likely to reach the second thin film. It significantly suppresses the situation of dissolution of the second thin film to achieve improvement in the characteristics of the electronic device fabricated. In addition, avoidance of dissolution of the second thin film also leads to improvement in the yield and productivity of this electronic device.

Preferably, in the step of depositing the laminate, the second thin film is deposited so that the outer edge of the second thin film is located inside an entire outer edge of the first thin film. In this case, the etching solution or abrasive circumvents the first thin film before arrival at the second thin film, in the entire marginal region of the outer edge of the second thin film, whereby the second thin film of the electronic device becomes far less likely to be dissolved.

Preferably, the laminate includes a multilayer structure in which a piezoelectric film is interposed between a pair of electrode films; the first thin film is one of the electrode films, and the second thin film is the piezoelectric film. Furthermore, preferably, the laminate includes a multilayer structure in which a piezoelectric film is interposed between a pair of electrode films, and includes an oxide film interposed between the substrate and the electrode film closer to the substrate out of the pair of electrode films; the first thin film is the oxide film, and the second thin film is the piezoelectric film. In these cases, dissolution of the piezoelectric film being the second thin film, with the etching solution is significantly suppressed and a piezoelectric device is obtained with excellent piezoelectric characteristics.

Preferably, in the step of forming the protecting film, the protecting film is formed in a plurality of separate stages. In this case, the second and subsequent formation of the protecting film allows us to adjust the size of the protecting film or to change the constituent material of the protecting film and it is thus feasible to achieve diversification of the protecting film.

An electronic device according to the present invention is an electronic device obtained by removing with an etching solution a substrate from a multilayer board having a laminate to become the electronic device formed on the substrate, wherein the laminate has one surface and side face covered by a protecting film and another surface exposed from the protecting film and comprises a first thin film, and a second thin film being located on the one surface side of the first thin film and more likely to be dissolved in the etching solution than the first thin film, and wherein an outer edge of the second thin film is located inside an outer edge of at least a portion of the first thin film.

In this electronic device, the outer edge of the second thin film located on the one surface side of the first thin film of the laminate is located inside the outer edge of at least a portion of the first thin film. For this reason, when the etching solution permeates between the protecting film and the laminate in the removal of the substrate from the multilayer board, the etching solution circumvents the first thin film before arrival at the second thin film, in the marginal region where the outer edge of the second thin film is located inside the outer edge of the first thin film. Namely, the path of the etching solution to the second thin film is significantly extended by the first thin film. It is noted herein that in the conventional electronic device the first thin film and the second thin film are formed with their outer edges approximately coinciding with each other and thus the etching solution directly reaches the second thin film, without circumventing the first thin film. Therefore, the electronic device according to the present invention has the structure wherein the path of the etching solution to the second thin film is extended so that the etching solution is less likely to reach the second thin film. It significantly suppresses the situation of dissolution of the second thin film and provides the electronic device with excellent characteristics. In addition, avoidance of dissolution of the second thin film leads to improvement in the yield and productivity of the electronic device.

The electronic device according to the present invention is an electronic device obtained by removing with an abrasive containing a liquid a substrate from a multilayer board having a laminate to become the electronic device formed on the substrate, wherein the laminate has one surface and side face covered by a protecting film and another surface exposed from the protecting film, and comprises a first thin film, and a second thin film being located on the one surface side of the first thin film and more likely to be dissolved in the abrasive than the first thin film, and wherein an outer edge of the second thin film is located inside an outer edge of at least a portion of the first thin film.

In this electronic device, the outer edge of the second thin film located on the one surface side of the first thin film of the laminate is located inside the outer edge of at least a portion of the first thin film. For this reason, when the abrasive permeates between the protecting film and the laminate in the removal of the substrate from the multilayer board, the abrasive circumvents the first thin film before arrival at the second thin film, in the marginal region where the outer edge of the second thin film is located inside the outer edge of the first thin film. Namely, the path of the abrasive to the second thin film is significantly extended by the first thin film. It is noted herein that in the conventional electronic device the first thin film and the second thin film are formed with their outer edges approximately coinciding with each other and thus the abrasive directly reaches the second thin film, without circumventing the first thin film. Therefore, the electronic device according to the present invention has the structure wherein the path of the abrasive to the second thin film is extended so that the abrasive is less likely to reach the second thin film. It significantly suppresses the situation of dissolution of the second thin film and provides the electronic device with excellent characteristics. In addition, avoidance of dissolution of the second thin film leads to improvement in the yield and productivity of the electronic device.

Preferably, the outer edge of the second thin film is located inside an entire outer edge of the first thin film. In this case, the etching solution or abrasive circumvents the first thin film before arrival at the second thin film, in the entire marginal region of the outer edge of the second thin film, whereby the second thin film of the electronic device becomes far less likely to be dissolved.

Preferably, the laminate includes a multilayer structure in which a piezoelectric film is interposed between a pair of electrode films; the first thin film is one of the electrode films, and the second thin film is the piezoelectric film. Furthermore, preferably, the laminate includes a multilayer structure in which a piezoelectric film is interposed between a pair of electrode films, and includes an oxide film interposed between the substrate and the electrode film closer to the substrate out of the pair of electrode films; the first thin film is the oxide film, and the second thin film is the piezoelectric film. In these cases, dissolution of the piezoelectric film being the second thin film, with the etching solution or abrasive is significantly suppressed and a piezoelectric device is obtained with excellent piezoelectric characteristics.

Preferably, the protecting film is comprised of a plurality of protecting films. In this case, it is easy to change the size and constituent material of the protecting film and it is thus feasible to achieve diversification of the protecting film.

DESCRIPTION OF THE PREFERRED EMBODIMENTS

A mode believed best for carrying out the electronic device and method of making the same according to the present invention will be described below in detail with reference to the accompanying drawings. Identical or equivalent elements will be denoted by the same reference symbols, without redundant description.

Embodiments of the present invention will be described as examples of piezoelectric devices being a type of electronic devices.

First Embodiment

First, a making system (evaporation system) used in making of this piezoelectric device will be described with reference to FIG. 1.

Figure 1:
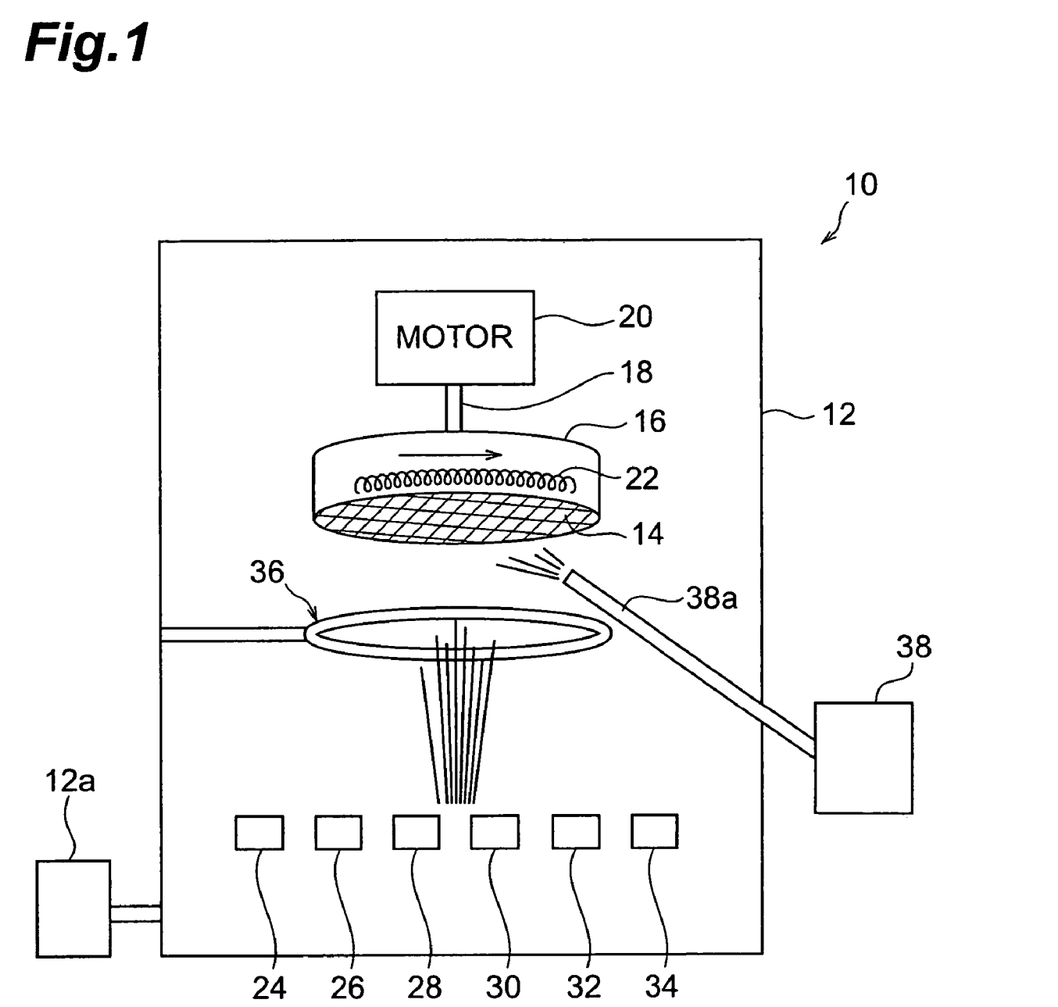
FIG. 1 is a schematic configuration diagram showing a thin film making system used in making of a piezoelectric device according to an embodiment of the present invention.

As shown in FIG. 1, the evaporation system 10 is provided with a vacuum chamber 12 and this vacuum chamber 12 is vacuated inside by an evacuator 12a. A holder 16 for holding a monocrystalline Si substrate 14 is arranged in the lower part of the vacuum chamber 12. A motor 20 is connected through a rotational shaft 18 to this holder 16 and the holder 16 is rotated by this motor 20 so that the monocrystalline Si substrate 14 can be rotated in the plane of the substrate. A heater 22 for heating the monocrystalline Si substrate 14 is incorporated in the holder 16.

There are Zr evaporator 24, Y evaporator 26, Pt evaporator 28, Pb evaporator 30, Ti evaporator 32, and La evaporator 34 arranged below the holder 16. Each of these evaporators 24, 26, 28, 30, 32, 34 is provided with a corresponding metal source and with an energy supply (electron beam generator, resistance heater, or the like) for supplying energy for evaporation to the metal source.

A loop RF antenna 36 is provided between the evaporators 24, 26, 28, 30, 32, 34 and the holder 16 so as to surround an emission route of evaporated materials emitted from the evaporators 24, 26, 28, 30, 32, 34. The evaporation system 10 is also provided with a gas supply 38 for supplying an oxidizing gas, and a supply port 38a of this gas supply 38 is arranged immediately below the holder 16. For this reason, the oxidizing gas has a high partial pressure in the vicinity of the monocrystalline Si substrate 14. Collaboration of these RF antenna 36 and gas supply 38 creates an environment of oxygen plasma to implement a high-accuracy film formation process. The oxidizing gas used in the film formation process can be, for example, oxygen, ozone, atomic oxygen, $NO_2$, or the like.

Next, a procedure of making the piezoelectric device according to the first embodiment, using the above-described evaporation system 10, will be described with reference to FIGS. 2 and 3.

First, a monocrystalline Si substrate 14 is set on the holder 16 of the evaporation system 10 so that a substrate surface 14a of the (100) plane exposed faces down. Here the substrate surface 14a is preferably one resulting from etching cleaning of a surface of a mirror-finished wafer. The etching cleaning is carried out with a 40% ammonium fluoride aqueous solution or the like. Since the cleaned monocrystalline Si substrate 14 demonstrates extremely high reactivity, it is preferably treated by a predetermined surface treatment to protect it from rearrangement, contamination, and so on.

Figure 2:
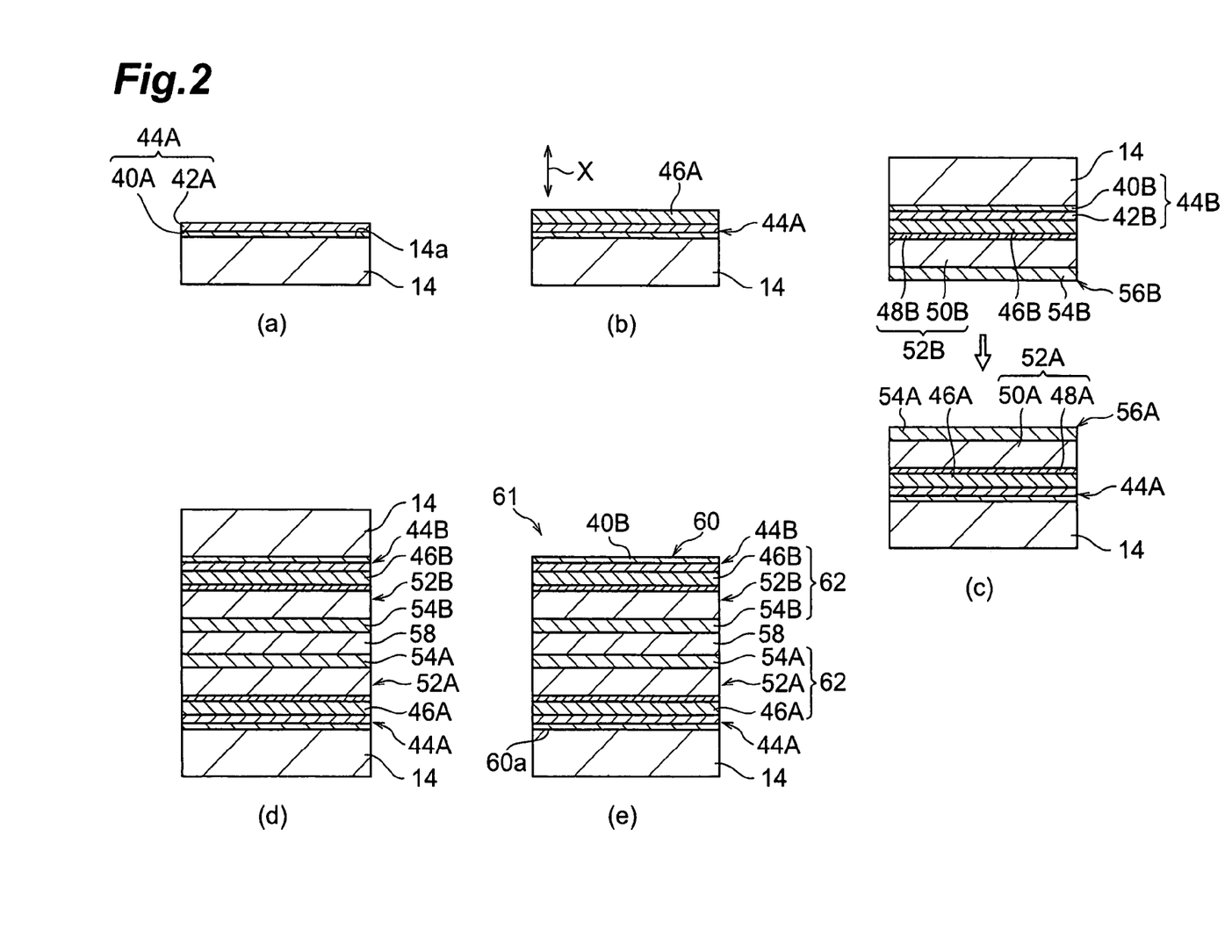
FIG. 2 is an illustration showing the first half of a procedure of making the piezoelectric device according to the first embodiment of the present invention.

Next, a $ZrO_2$ film 40A and a $Y_2O_3$ film 42A are successively epitaxially grown in the thickness of 0.01 μm and in the thickness of 0.04 μm, respectively, on the substrate surface 14a of the monocrystalline Si substrate 14 to form an oxide film 44A (cf. part (a) in FIG. 2). Here the $ZrO_2$ film 40A is an epitaxial film of zirconium dioxide ($ZrO_2$), and the $Y_2O_3$ film 42A an epitaxial film of yttrium oxide ($Y_2O_3$). More specifically, while supplying Zr from the Zr evaporator 24 or Y from the Y evaporator 26, the $ZrO_2$ film 40A and the $Y_2O_3$ film 42A are deposited on the surface 14a of the monocrystalline Si substrate 14 heated at 400° C. or higher, under the oxygen plasma environment acquired by collaboration of RF antenna 36 and gas supply 38 described above. The growth face of the $ZrO_2$ film 40A epitaxially grown as described above becomes the (001) plane, and the growth face of the $Y_2O_3$ film 42A becomes the (100) plane.

Where the film formation is carried out on a large substrate area of not less than 10 $cm^2$, e.g., a large monocrystalline substrate area in the diameter of 2 inches, the monocrystalline Si substrate 14 is rotated by the motor 20 to supply oxygen in high partial pressure to the entire surface of the substrate, thereby enabling fabrication of film over the large area. At this time, the rotation speed of the substrate is desirably not less than 10 rpm. If the rotation speed is too low, there will occur a distribution of film thicknesses in the substrate plane. There is no particular upper limit to the rotation speed of the substrate, but it is normally approximately 120 rpm in view of the mechanism of the vacuum system.

Next, an electrode film (first thin film) 46A is epitaxially grown in the thickness of 0.2 μm on the oxide film 44A (cf. part (b) in FIG. 2). More specifically, Pt is supplied from the Pt evaporator 28 toward the top surface of the monocrystalline Si substrate 14 under the aforementioned oxygen plasma environment to deposit the electrode film 46A of Pt. The electrode film 46A epitaxially grown in this manner is oriented in the <100> direction.

Furthermore, a PLT film 48A and a PZT film 50A are successively epitaxially grown in the thickness of 0.02 μm and in the thickness of 2.5 μm, respectively, on the electrode film 46A to form a piezoelectric film (second thin film) 52A. Here the PLT film 48A is an epitaxial film of lead titanate doped with La (PLT), and the PZT film 50A is an epitaxial film of lead zirconate titanate (PZT). More specifically, Ti from the Ti evaporator 32, Pb from the Pb evaporator 30, La from the La evaporator 34, and Zr from the Zr evaporator 24 are selectively supplied onto the top surface of the heated monocrystalline Si substrate 14 under the aforementioned oxygen plasma environment to deposit the PLT film 48A and PZT film 50A. Each of these PLT film 48A and PZT film 50A has its growth direction (thickness direction) along the <001> direction and is c-axis singly oriented. Namely, this piezoelectric film 52A is a perovskite piezoelectric film.

Next, an electrode film 54A is epitaxially grown in the thickness of 0.2 μm on the piezoelectric film 52A (cf. part (c) in FIG. 2). More specifically, Pt is supplied from the Pt evaporator 28 onto the top surface of the monocrystalline Si substrate 14 under the aforementioned oxygen plasma environment to deposit the electrode film 54A of Pt.

The above completes fabrication of a first substrate 56A in which the oxide film 44A, electrode film 46A, piezoelectric film 52A, and electrode film 54A are successively laid on the monocrystalline Si substrate 14. Furthermore, another substrate (second substrate 56B), which is the same as the first substrate 56A, is prepared. Namely, this second substrate 56B is also one in which an oxide film 44B ($ZrO_2$ film 40B and $Y_2O_3$ film 42B), electrode film 46B, piezoelectric film 52B (PLT film 48B and PZT film 50B), and electrode film 54B, corresponding to the oxide film 44A, electrode film 46A, piezoelectric film 52A, and electrode film 54A of the first substrate 56A, respectively, are successively laid on a monocrystalline Si substrate 14.

Then the first and second substrates 56A, 56B are taken out of the making system 10 and the first substrate 56A and the second substrate 56B are bonded to each other with an adhesive so that the electrode film 54A being the topmost film of the first substrate 56A is superimposed on the electrode film 54B being the topmost film of the second substrate 56B (cf. part (d) in FIG. 2).

Then the monocrystalline Si substrate 14 on one side is removed with an etching solution such as, an alkaline solution such as potassium hydroxide, hydrofluoric acid, a hydrofluoric acid-nitric acid mixture or the like (cf. part (e) in FIG. 2). It results in obtaining a multilayer board 61 composed of a laminate 60 in which the electrode films 54A, 54B, piezoelectric films 52A, 52B, electrode films 46A, 46B, and oxide films 44A, 44B are successively arranged on both sides of an adhesive film 58, and the monocrystalline Si substrate 14 attached to one surface 60a (which will be referred to as a substrate surface) of the laminate 60. Namely, the laminate 60 is provided with two sets of multilayer structures 62 in which the piezoelectric film 52A or 52B is interposed between the electrode film pair (the pair of electrode film 46A and electrode film 54A, or the pair of electrode film 46B and electrode film 54B).

Figure 3:
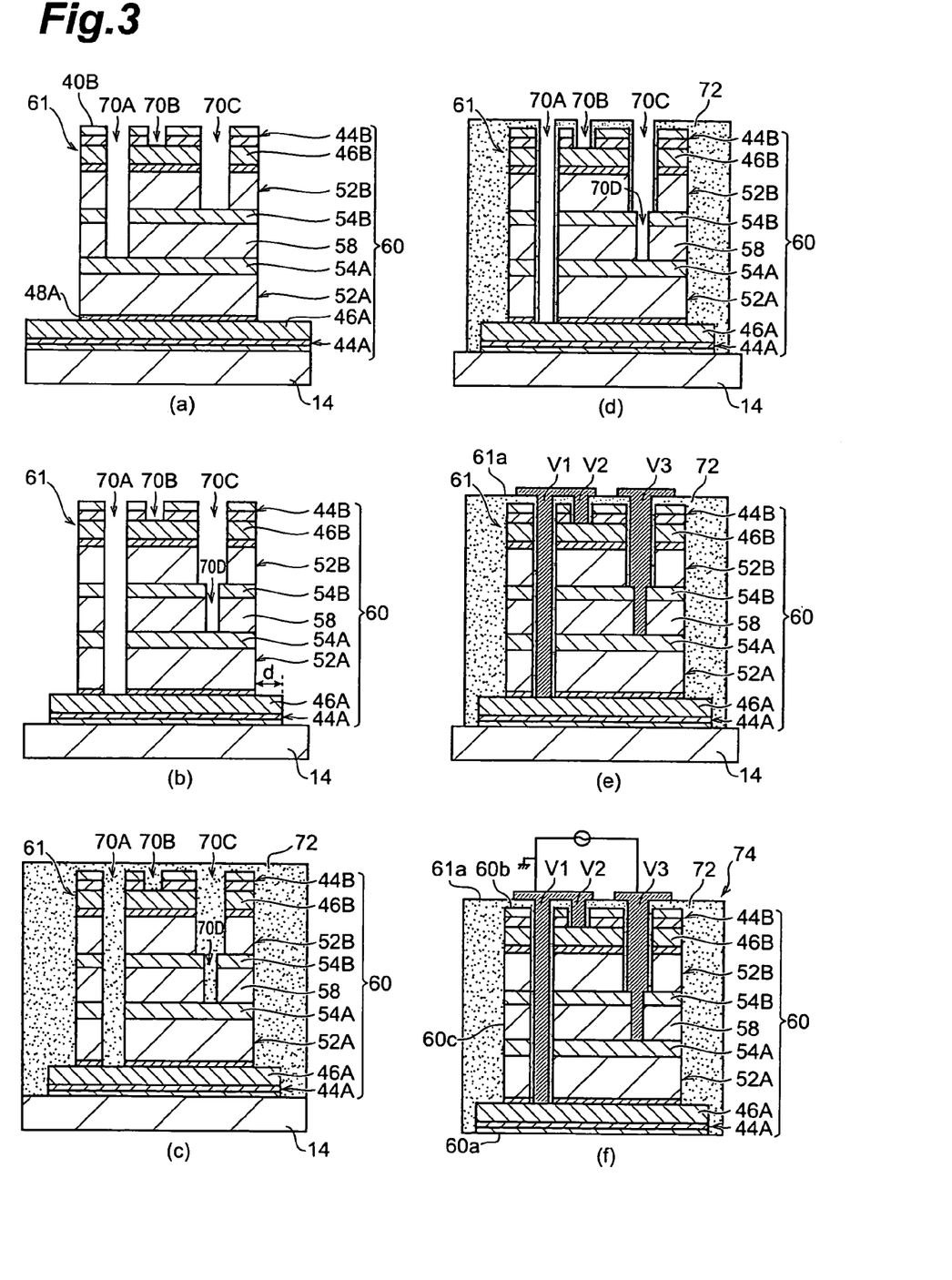
FIG. 3 is an illustration showing the second half of the procedure of making the piezoelectric device according to the first embodiment of the present invention.

Then the multilayer board 61 (i.e., the monocrystalline Si substrate 14 with the laminate 60 thereon) is patterned into a size corresponding to after-described piezoelectric device 74 and from the topmost $ZrO_2$ film 40B to the PLT film 48A by the well-known photolithography technology (cf. part (a) in FIG. 3). This patterning determines the outer edge of the piezoelectric film 52A. In conjunction with this patterning, three holes 70A, 70B, 70C reaching the electrode film 54A, electrode film 46B, and electrode film 54B, respectively, are formed in a portion of an individual laminate 60 separated by the patterning.

Subsequently, patterning of the electrode film 46A and oxide film 44A is carried out in the same manner as the above patterning, in the portion of the individual laminate 60 separated by the patterning (cf. part (b) in FIG. 3). This patterning is carried out so that the entire outer edge of the electrode film 46A and oxide film 44A is located outside the entire outer edge of the piezoelectric film 52A by a predetermined width d. This patterning results in completely separating the individual laminate 60 to become a piezoelectric device 74, on the substrate 14. In conjunction with this patterning, in the individual laminate 60 the hole 70A is extended down to the electrode film 46A and a hole 70D extending from the electrode film 54B to the electrode film 54A is formed in the bottom surface of the hole 70C.

Next, polyimide 72 is applied over the entire surface of the monocrystalline Si substrate 14 to integrally cover the top face and side face of the individual laminate 60 with polyimide (protecting film) 72 and to fill the holes 70A-70D of the individual laminate 60 with polyimide 72 (cf. part (c) in FIG. 3). Then the polyimide 72 is patterned to determine the outer edge of polyimide 72 corresponding to the individual laminate 60 (cf. part (d) in FIG. 3). At this time, the polyimide 72 in the holes 70A-70C is removed by etching to the size a little smaller than the holes 70A-70C, thereby obtaining the holes 70A-70C with the inside face covered with polyimide 72, and the hole 70D with the inside face exposed.

Subsequently, in the individual laminate 60 Au is filled in each of the holes 70A-70D with the inside face covered by polyimide 72, to form three vias V1, V2, V3 (cf. part (e) in FIG. 3). Namely, via V1 extends to the electrode film 46A, and via V2 to the electrode film 46B. Furthermore, via V1 and via V2 are connected to each other on the top face of polyimide 72, and the electrode film 46A and the electrode film 46B are electrically connected to each other by the via V1 and via V2. The via V3 extends to the electrode film 54A and, since the inside face of the hole 70D is not covered by the polyimide 72, the electrode film 54A and the electrode film 54B are electrically connected to each other by this via V3.

Finally, the remaining monocrystalline Si substrate 14 is removed with an etching solution such as, an alkaline solution such as potassium hydroxide, hydrofluoric acid, a hydrofluoric acid-nitric acid mixture or the like (cf. part (f) in FIG. 3). It results in separating from the monocrystalline Si substrate 14 the laminate 60 in which one surface (i.e., surface 60b opposite to substrate surface 60a) and side face 60c are covered by the polyimide 72 and in which the other surface (i.e., substrate surface 60a) is exposed, and thereby obtaining a piezoelectric device 74. In use of this piezoelectric device 74, one terminal of an ac power supply is connected through the via V1 and via V2 to the electrode film 46A and electrode film 46B, and the other terminal is connected through the via V3 to the electrode film 54A and electrode film 54B.

Figure 4:
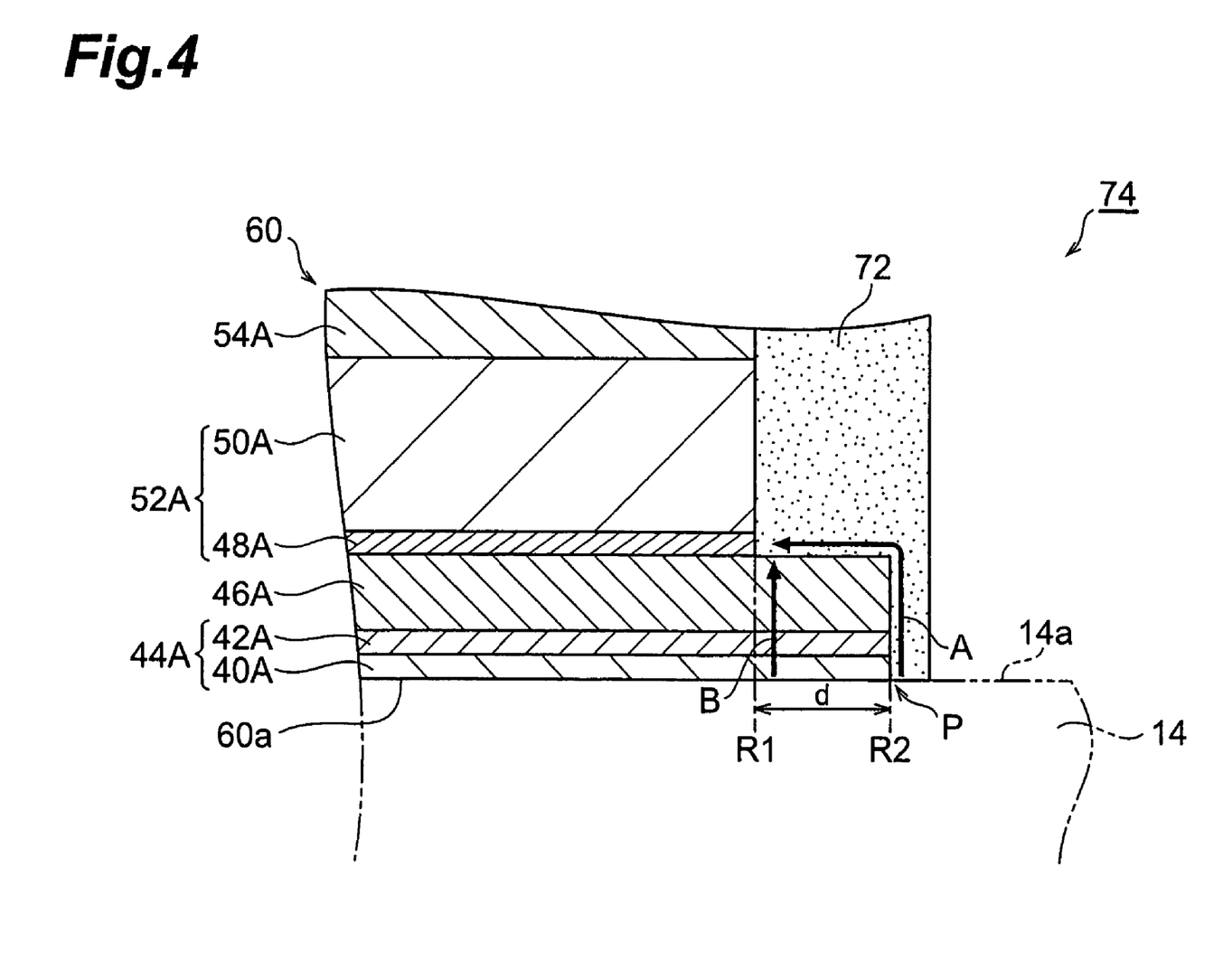
FIG. 4 is an enlarged drawing of major part of the piezoelectric device according to the first embodiment of the present invention.

Next, the aforementioned step of removing the second monocrystalline Si substrate 14 by etching in fabrication of the piezoelectric device 74 will be described in more detail with reference to FIG. 4.

For separating the laminate 60 from the monocrystalline Si substrate 14, the monocrystalline Si substrate 14 is immersed in an etching solution from the opposite side to the surface 14a on which the laminate 60 is formed. More specifically, a two-sided tape is used to attach the multilayer board 61 covered with polyimide 72 and provided with the vias V1, V2, V3 to a base material (not shown) such as polyvinyl chloride so that the top face 61a faces the base material, and the circumference of this multilayer board 61 is sealed. Then the whole is immersed in the etching solution. The Inventors confirmed that on that occasion the etching solution permeated through a joint P between polyimide 72 and laminate 60 on the substrate surface 60a of the laminate 60 to cause a situation of dissolution of the piezoelectric film 52A.

In the piezoelectric device 74, therefore, the outer edge R1 of the piezoelectric film 52A is located inside the outer edge R2 of the electrode film 46A with higher resistance to dissolution in the etching solution than the piezoelectric film 52A. For this reason, when the etching solution permeates between the polyimide 72 and the laminate 60, it passes through a route A to significantly circumvent the electrode film 46A. On the other hand, in the case of the conventional piezoelectric device fabricated so that the outer edge of the electrode film 46A approximately coincides with the outer edge of the piezoelectric film 52A, the etching solution passes through a route B to linearly and directly reach the piezoelectric film 52A, without circumventing the electrode film 46A. Namely, in the piezoelectric device 74 the route of the etching solution to the piezoelectric film 52A is significantly extended by the electrode film 46A, and the etching solution is less likely to reach the piezoelectric film 52A than in the conventional piezoelectric device. For this reason, the situation of dissolution of the piezoelectric film 52A with the etching solution is significantly suppressed in this piezoelectric device 74 and the characteristics of the device are improved as compared with the conventional piezoelectric device. In addition, avoidance of dissolution of the piezoelectric film 52A leads to improvement in the yield and productivity of the piezoelectric device 74.

In the piezoelectric device 74, as described above, the entire outer edge R1 of the piezoelectric film 52A is located inside the outer edge R2 of the electrode film 46A, whereby it is extremely hard for the etching solution to reach the piezoelectric film 52A. As long as at least a part of the outer edge R1 of the piezoelectric film 52A is located inside the outer edge R2 of the electrode film 46A, the etching solution circumvents the electrode film 46A in the outer edge part, thereby achieving the foregoing effect. It is, however, needless to mention that a more effective configuration is that the entire outer edge R1 of the piezoelectric film 52A is located inside the outer edge R2 of the electrode film 46A.

Figure 5:
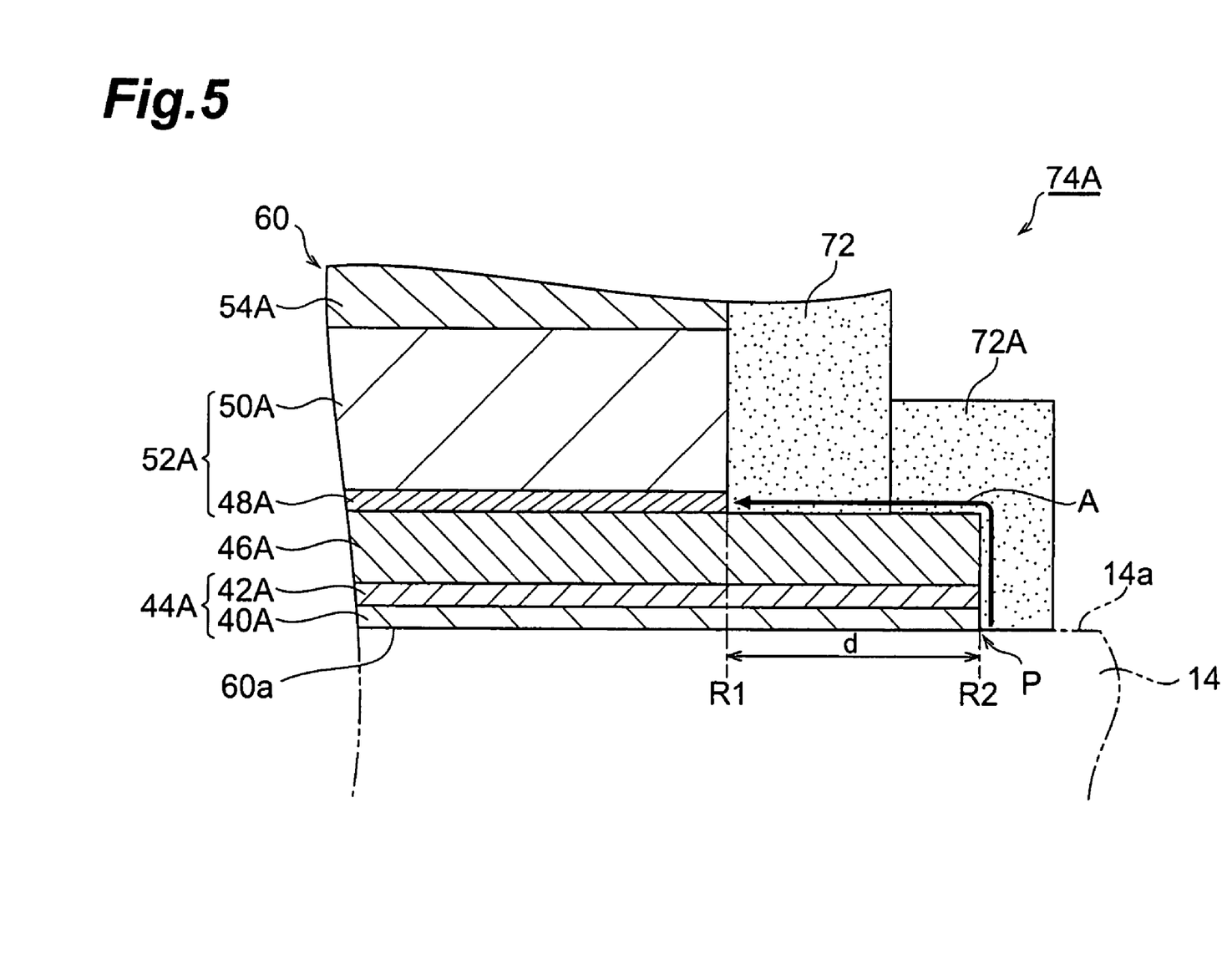
FIG. 5 is a view showing a piezoelectric device in a form different from FIG. 4.

The longer the distance (width) d between the outer edge R1 of the piezoelectric film 52A and the outer edge R2 of the electrode film 46A, the less likely the etching solution is to reach the piezoelectric film 52A, of course; therefore, it becomes feasible to more securely suppress the situation of dissolution of the piezoelectric film 52A. For this reason, the length d is more preferably not less than 10 times the total thickness of the thickness of the oxide film 44A (0.05 µm) and the thickness of the electrode film 46A (0.2 µm). If an increase of distance d by enlargement of the electrode film 46A results in exposing the electrode film 46A from the formed region of polyimide 72, the exposed part of the electrode film may be covered by another polyimide 72A different from the polyimide 72 (cf. FIG. 5). By adopting two polyimides 72, 72A in this manner, it becomes easy to change the size and constituent material of the protecting film and it thus becomes feasible to achieve diversification of the protecting film. Since the protecting film is formed in multiple stages in formation of the protecting film, the second or subsequent formation of the protecting film permits us to adjust the size of the protecting film or to change the constituent material of the protecting film, and it thus enables achievement of diversification of the protecting film.

Second Embodiment

Next, a procedure of making a piezoelectric device 74B according to the second embodiment will be described with reference to FIG. 6.

For making the piezoelectric device 74B according to the second embodiment, the multilayer board 61 is also prepared in the same procedure as in the first embodiment.

Figure 6:
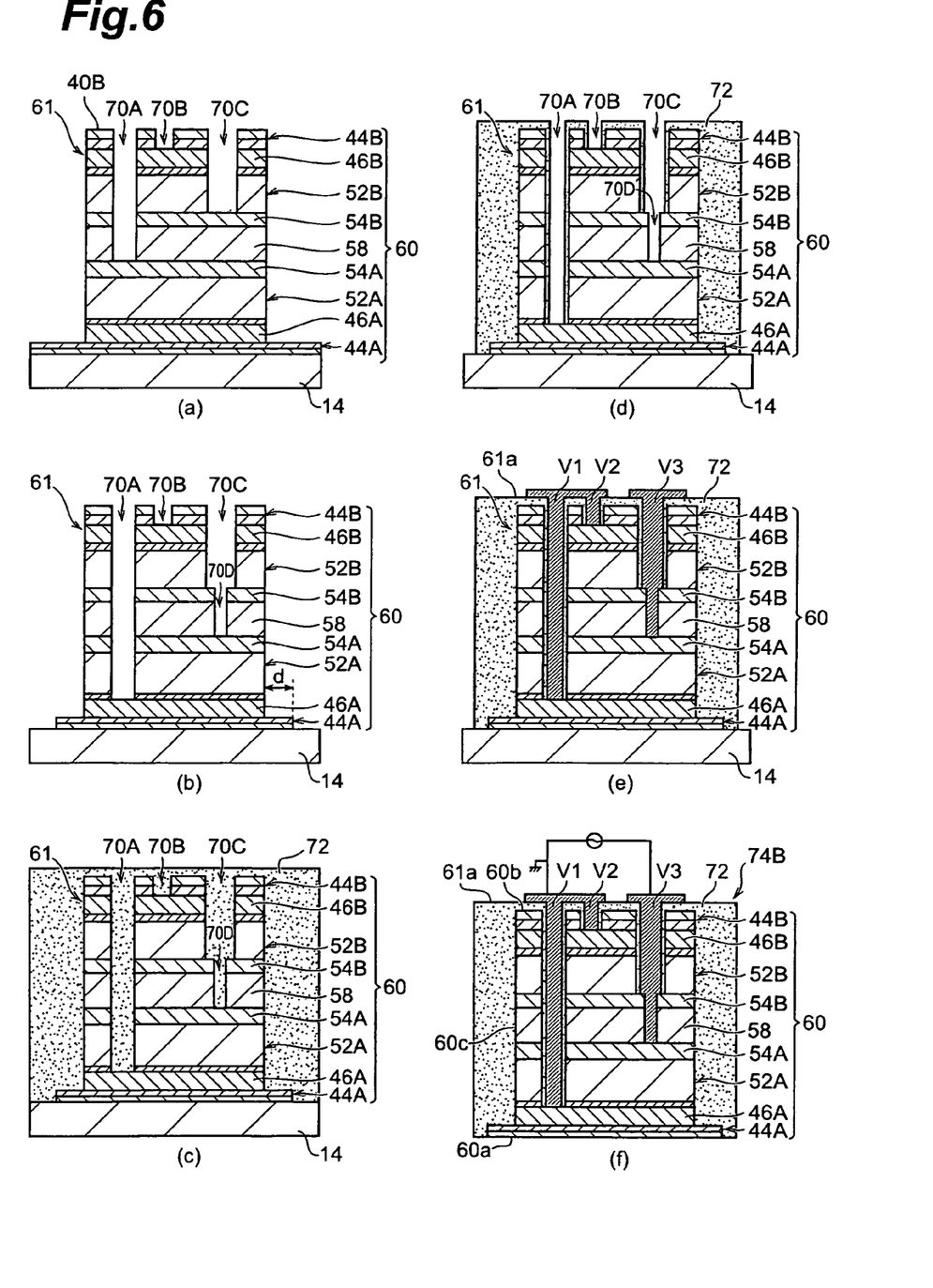
FIG. 6 is an illustration showing the second half of a procedure of making the piezoelectric device according to the second embodiment of the present invention.

Then the multilayer board 61 is patterned from the topmost $ZrO_2$ film 40B to the electrode film 46A so as to achieve the size corresponding to after-described piezoelectric device 74B, by the well-known photolithography technology (cf. part (a) in FIG. 6). This patterning determines the outer edge of the piezoelectric film 52A. In conjunction with this patterning, holes 70A, 70B, and 70C similar to those in the first embodiment are formed in the portion of individual laminate 60 separated by the patterning.

Subsequently, patterning of the oxide film 44A (first thin film) is carried out in the same manner as the above patterning, in the portion of individual laminate 60 separated by the patterning (cf. part (b) in FIG. 6). This patterning is carried out so that the entire outer edge of the oxide film 44A is located outside the entire outer edge of the piezoelectric film 52A by the predetermined width d. This patterning results in completely separating the individual laminate 60 to become the piezoelectric device 74B, on the substrate 14. In conjunction with this patterning, in the individual laminate 60 the hole 70A is extended down to the electrode film 46A and a hole 70D extending from the electrode film 54B to the electrode film 54A is formed in the bottom surface of the hole 70C.

Thereafter, the application of polyimide 72 (cf. part (c) in FIG. 6), the patterning of polyimide 72 (cf. part (d) in FIG. 6), the formation of vias V1, V2, V3 (cf. part (e) in FIG. 6), and the removal of monocrystalline Si substrate 14 (cf. part (f) in FIG. 6) are carried out according to the procedure similar to that in the first embodiment, to complete fabrication of piezoelectric device 74B. As apparent from the above description of the method for making, this piezoelectric device 74B is different only in the piezoelectric film 46A from the piezoelectric device 74 of the first embodiment.

Figure 7:
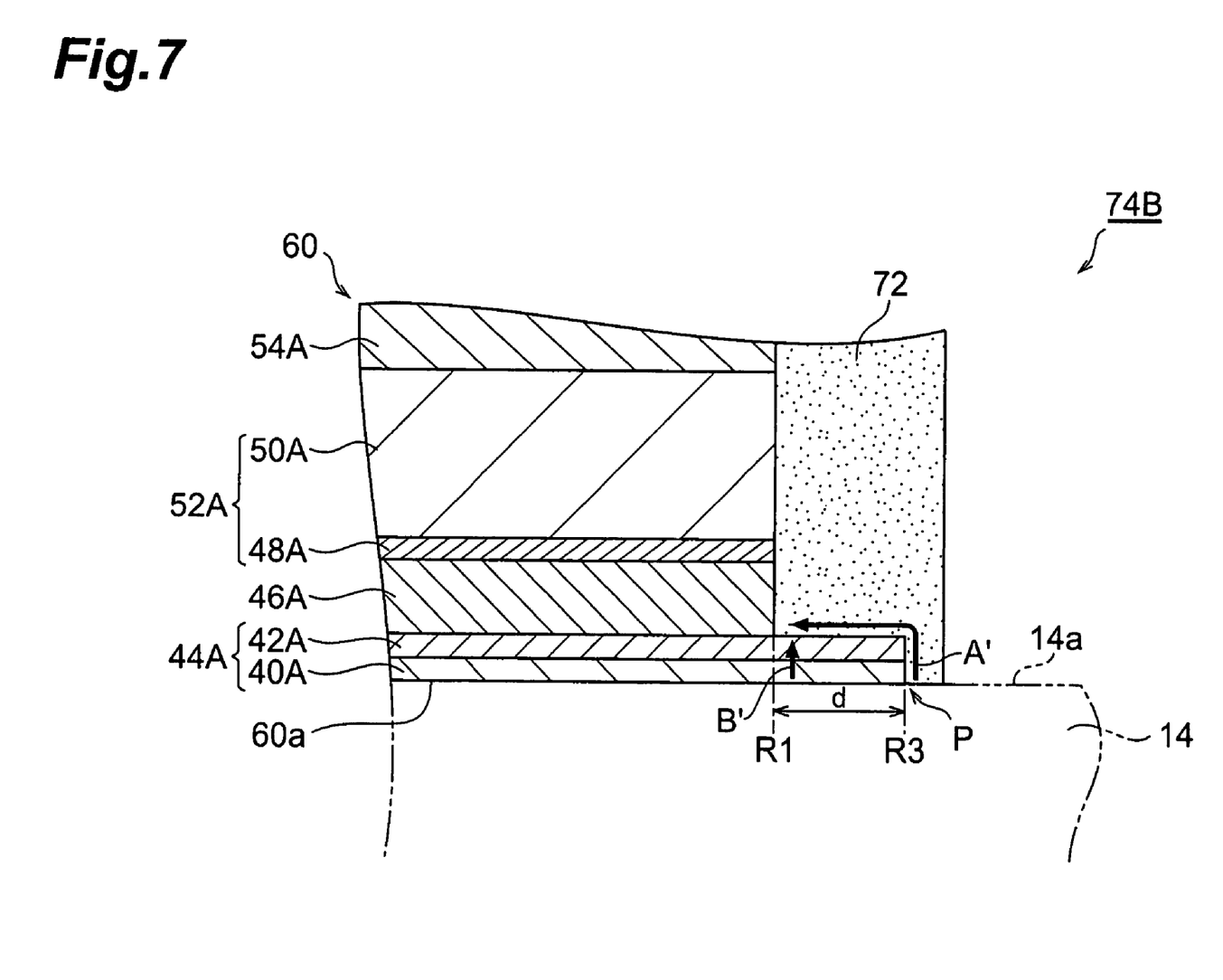
FIG. 7 is an enlarged drawing of major part of the piezoelectric device according to the second embodiment of the present invention.

Next, the step of removing the second monocrystalline Si substrate 14 by etching in the fabrication of the piezoelectric device 74B will be described in more detail with reference to FIG. 7.

In the second embodiment the separation of the laminate 60 from the monocrystalline Si substrate 14 is also carried out by a method similar to that in the first embodiment. In the piezoelectric device 74B of the second embodiment, the outer edge R1 of the piezoelectric film 52A is arranged inside the outer edge R3 of the oxide film 44A with higher resistance to dissolution in the etching solution than the piezoelectric film 52A. For this reason, when the etching solution permeates between polyimide 72 and laminate 60, the etching solution passes through a route A' to significantly circumvent the oxide film 44A. On the other hand, in the case of the conventional piezoelectric device in which the outer edge of the oxide film 44A approximately coincides with the outer edge of the piezoelectric film 52A, the etching solution passes through a route B' to linearly and directly reach the piezoelectric film 52A, without circumventing the oxide film 44A. Namely, the route of the etching solution to the piezoelectric film 52A is significantly extended by the oxide film 44A in the piezoelectric device 74B, and the etching solution is less likely to reach the piezoelectric film 52A than in the conventional piezoelectric device. In this piezoelectric device 74B, as in the aforementioned piezoelectric devices 74, 74A, the situation of dissolution of the piezoelectric film 52A with the etching solution is thus also significantly suppressed, and the characteristics of the device are improved as compared with the conventional piezoelectric device. In addition, avoidance of dissolution of the piezoelectric film 52A also leads to improvement in the yield and productivity of this piezoelectric device 74B.

The Inventors conducted an experiment as described below, in order to check the permeation of the etching solution in more detail. Specifically, we prepared piezoelectric devices 74 (samples #2) of the first embodiment, piezoelectric devices 74B (samples #3) of the second embodiment, and conventional piezoelectric devices (samples #1) before the etching removal of the second monocrystalline Si substrate 14, 400 samples each. The single crystal of SiC remaining in each piezoelectric device was removed by etching with the aforementioned etching solution and thereafter permeation of the etching solution was checked by whether the piezoelectric layer was corroded. We calculated percentages of piezoelectric devices without permeation of the etching solution (permeation prevention rates). The results of the experiment were as presented in Table 1 below.

TABLE 1

|  | Total Number of Samples | Number of Samples without Corrosion | Permeation Prevention Rate (%) |
| --- | --- | --- | --- |
| Samples #1 | 400 | 0 | 0.0 |
| Samples #2 | 400 | 232 | 58.0 |
| Samples #3 | 400 | 386 | 96.5 |

Namely, with the samples #1 of the conventional piezoelectric devices, permeation of the etching solution was observed in all the samples. On the other hand, with the samples #2 of the piezoelectric devices 74 of the first embodiment and the samples #3 of the piezoelectric devices 74B of the second embodiment, there were 232 samples and 386 samples without permeation, respectively. It is apparent from this result that when the route of the etching solution to the piezoelectric film is extended as in the case of the samples #2 and #3, the permeation of the etching solution is obviously suppressed as compared with the conventional piezoelectric devices of samples #1.

Furthermore, it is also seen from Table 1 that the permeation of the etching solution is more prevented in the piezoelectric devices 74B (samples #3) than in the piezoelectric devices 74 (samples #2). This is considered to arise from the difference of adhesion of the electrode film 46A and oxide film 44A to polyimide 72. Namely, the adhesion strength between oxide film 44A and polyimide 72 is higher than that between electrode film 46A and polyimide 72, and this is a conceivable reason why the permeation prevention rate is higher in the piezoelectric devices 74B with the wider contact region between oxide film 44A and polyimide 72. In the case of the samples #3, it is considered that the permeation of the etching solution can be perfectly suppressed by performing the film formation steps and patterning steps in the production more accurately so as to inhibit influence of particles and damages on the device.

Therefore, the piezoelectric device 74B of the second embodiment is able to more securely suppress the situation of dissolution of the piezoelectric film 52A with the etching solution than the piezoelectric devices 74, 74A of the first embodiment.

As long as at least a part of the outer edge R3 of the oxide film 44A is located inside the outer edge R1 of the electrode film 46A in the piezoelectric device 74B, the etching solution also circumvents the electrode film 46A in the outer edge part, so as to achieve the aforementioned effect. It is, however, needless to mention that a more effective configuration is such that the entire outer edge R1 of the piezoelectric film 52A is located inside the outer edge R3 of the oxide film 44A.

Figure 8:
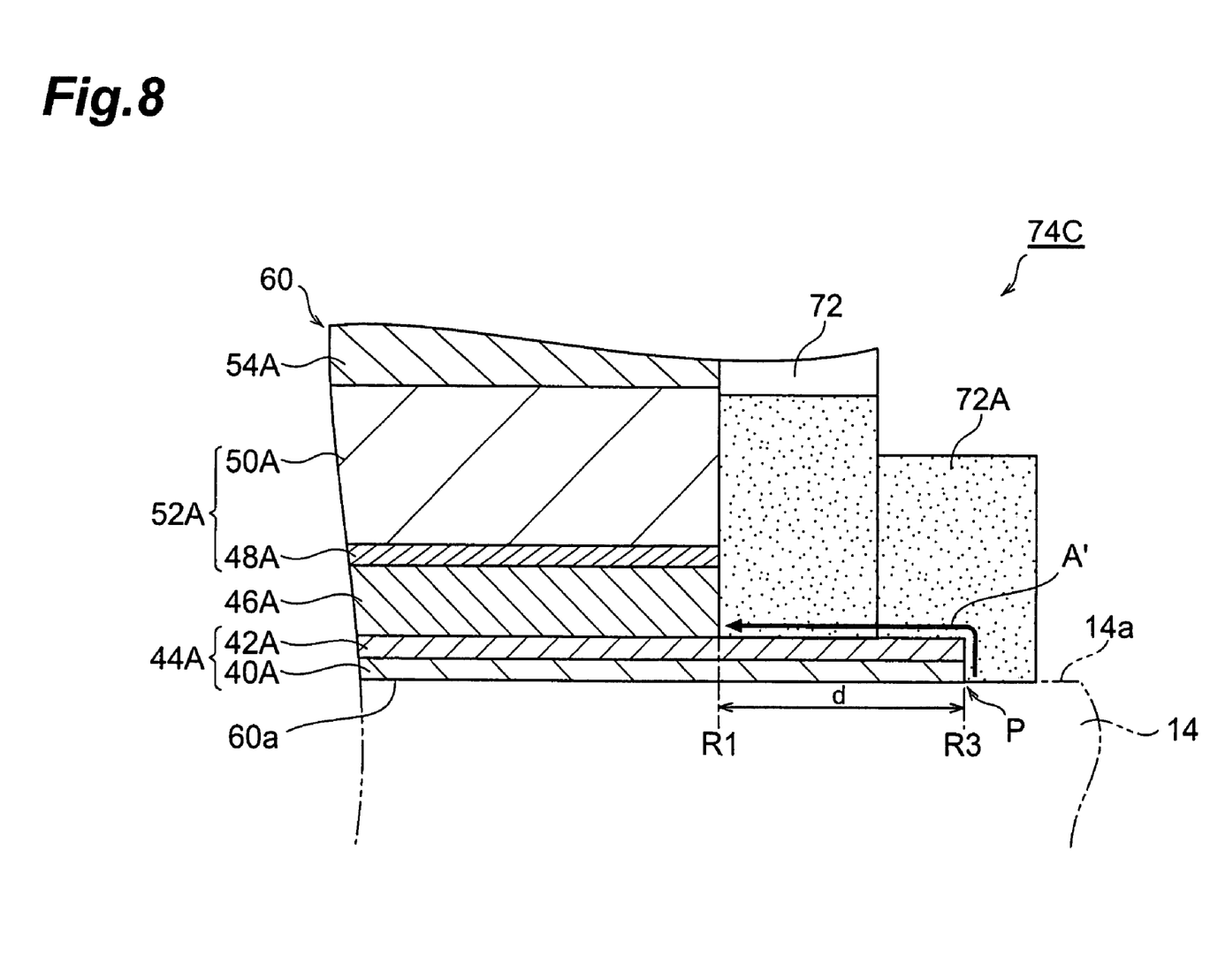
FIG. 8 is a view showing a piezoelectric device in a form different from FIG. 7.

In addition, the longer the distance (width) d between the outer edge R1 of the piezoelectric film 52A and the outer edge R3 of the oxide film 44A, the less likely the etching solution is to reach the piezoelectric film 52A, of course; therefore, it is feasible to more securely suppress the situation of dissolution of the piezoelectric film 52A. For this reason, the piezoelectric device of the second embodiment can also be constructed as a piezoelectric device 74C covered with polyimide 72 and another polyimide 72A (cf. FIG. 8), like the piezoelectric device 74A of the first embodiment.

The present invention is by no means limited to the above embodiments but can be modified in various ways. For example, the electronic devices are not limited to the piezoelectric devices, but may be various devices with functional thin films such as dielectric films, conductor films, and semiconductor films. The number of layers in the laminate is not limited to the aforementioned number, either. The number of layers can be suitably selected from the numbers of layers of not less than 2 (first thin film and second thin film).

The substrates are not limited to the monocrystalline Si substrates, but may be monocrystalline substrates or polycrystalline substrates made of materials different from Si. The solution to be used for removal of the substrates is not limited to the aforementioned etching solutions as long as it is a liquid that can dissolve the second thin film more than the first thin film; for example, it may be an abrasive containing a liquid. The protecting film is not limited to polyimide, but can be suitably selected from materials with sufficiently high resistance to the etching solution used.

The constituent material of the electrode films is not limited to Pt, but may be a material containing at least one species selected from a metal material group consisting of Au, Ir, Pd, Rh, Cu, and Ag, for example. Furthermore, the piezoelectric film is not limited to the aforementioned configuration, but may be a c-axis singly oriented thin film made of lead strontium titanate or lead titanate. It is also possible to adopt any other making system for fabrication of the thin-film piezoelectric element; for example, it is also possible to use a sputtering system or MBE system.

The above embodiments described the methods of making electronic devices (piezoelectric devices) finally separated into individual devices, but it is also possible to adopt a configuration wherein the multilayer board in the state shown in the part (c) in FIG. 3 or in the part (c) in FIG. 6 is bonded to a separately prepared substrate with an adhesive or the like to obtain a plurality of electronic devices arrayed on this substrate.

What is claimed is:

1. A method of making an electronic device, the method comprising:
    a step of depositing on a substrate, a laminate comprising a first thin film formed of a first material, and a second thin film being formed on the first thin film and formed of a second material having lower resistance to dissolution in an etching solution than the first material;
    a step of forming a protecting film to cover the laminate; and
    a step of removing the substrate from a multilayer board having the laminate and the protecting film, using the etching solution,
    wherein in the step of depositing the laminate, the second thin film is deposited so that an outer edge of the second thin film is located inside an outer edge of at least a portion of the first thin film.

2. The method according to claim 1, wherein in the step of depositing the laminate, the second thin film is deposited so that the outer edge of the second thin film is located inside an entire outer edge of the first thin film.

3. The method according to claim 1,
    wherein the laminate includes a multilayer structure in which a piezoelectric film is interposed between a pair of electrode films, and
    wherein the first thin film is one of said electrode films and the second thin film is the piezoelectric film.

4. The method according to claim 1,
    wherein the laminate includes a multilayer structure in which a piezoelectric film is interposed between a pair of electrode films, and includes an oxide film interposed between the substrate and the electrode film closer to the substrate out of the pair of electrode films, and wherein the first thin film is the oxide film and the second thin film is the piezoelectric film.

5. The method according to claim 1, wherein in the step of forming the protecting film, the protecting film is formed in a plurality of separate stages.

6. The method according to claim 1, wherein in the step of depositing the laminate, the second thin film is deposited so that a length d between the outer edges of the first thin film and the second thin film is not less than 10 times the total of thickness of the first thin film and second thin film.

7. A method of making an electronic device, the method comprising:

a step of depositing on a substrate, a laminate comprising a first thin film formed of a first material, and a second thin film being formed on the first thin film and formed of a second material having lower resistance to dissolution in an abrasive containing a liquid than the first material;

a step of forming a protecting film to cover the laminate; and a step of removing the substrate from a multilayer board having the laminate and the protecting film, using the abrasive, wherein in the step of depositing the laminate, the second thin film is deposited so that an outer edge of the second thin film is located inside an outer edge of at least a portion of the first thin film.

8. The method according to claim 7, wherein in the step of depositing the laminate, the second thin film is deposited so that the outer edge of the second thin film is located inside an entire outer edge of the first thin film.

9. The method according to claim 7, wherein the laminate includes a multilayer structure in which a piezoelectric film is interposed between a pair of electrode films, and wherein the first thin film is one of said electrode films and the second thin film is the piezoelectric film.

10. The method according to claim 7, wherein the laminate includes a multilayer structure in which a piezoelectric film is interposed between a pair of electrode films, and includes an oxide film interposed between the substrate and the electrode film closer to the substrate out of the pair of electrode films, and wherein the first thin film is the oxide film and the second thin film is the piezoelectric film.

11. The method according to claim 7, wherein in the step of forming the protecting film, the protecting film is formed in a plurality of separate stages.

\* \* \* \* \*